United States Patent
Lin et al.

(10) Patent No.: US 9,059,157 B2
(45) Date of Patent: Jun. 16, 2015

(54) INTEGRATED CIRCUIT PACKAGING SYSTEM WITH SUBSTRATE AND METHOD OF MANUFACTURE THEREOF

(71) Applicants: Yaojian Lin, Singapore (SG); Il Kwon Shim, Singapore (SG); JunMo Koo, Singapore (SG); Jose Alvin Caparas, Singapore (SG)

(72) Inventors: Yaojian Lin, Singapore (SG); Il Kwon Shim, Singapore (SG); JunMo Koo, Singapore (SG); Jose Alvin Caparas, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 0 days.

(21) Appl. No.: 13/842,582

(22) Filed: Mar. 15, 2013

(65) Prior Publication Data

US 2013/0320525 A1 Dec. 5, 2013

Related U.S. Application Data

(60) Provisional application No. 61/655,431, filed on Jun. 4, 2012.

(51) Int. Cl.
*H01L 23/498* (2006.01)
*H01L 21/768* (2006.01)
*H01L 23/00* (2006.01)
*H01L 23/16* (2006.01)

(52) U.S. Cl.
CPC .... *H01L 23/49811* (2013.01); *H01L 21/76885* (2013.01); *H01L 24/19* (2013.01); *H01L 23/16* (2013.01); *H01L 2224/04105* (2013.01); *H01L 2224/12105* (2013.01); *H01L 2224/73267* (2013.01); *H01L 2225/1035* (2013.01); *H01L 2225/1058* (2013.01); *H01L 2924/15311* (2013.01); *H01L 2924/3511* (2013.01); *H01L 23/49816* (2013.01)

(58) Field of Classification Search
CPC ... H01L 21/76885; H01L 24/19; H01L 23/16; H01L 23/49811; H01L 2225/1058; H01L 2225/1035; H01L 2224/73267; H01L 2924/3511; H01L 2924/15311; H01L 2224/1205; H01L 2224/04105; H01L 23/49816
USPC .......... 257/737, 738, 774, 773, 778, E23.001, 257/E23.194, 692, E23.174, E23.011, 678, 257/E23.145
See application file for complete search history.

(56) References Cited

U.S. PATENT DOCUMENTS

| | | | |
|---|---|---|---|
| 6,119,335 A | 9/2000 | Park et al. | |
| 6,790,710 B2 * | 9/2004 | McLellan et al. | 438/122 |
| 6,798,049 B1 * | 9/2004 | Shin et al. | 257/678 |
| 7,274,095 B2 * | 9/2007 | Fee et al. | 257/680 |
| 8,012,797 B2 * | 9/2011 | Shen et al. | 438/107 |
| 8,116,066 B2 * | 2/2012 | Inoue | 361/321.4 |
| 8,158,888 B2 * | 4/2012 | Shen et al. | 174/260 |
| 8,298,931 B2 | 10/2012 | Raghuram et al. | |
| 8,319,338 B1 * | 11/2012 | Berry et al. | 257/738 |
| 8,592,992 B2 * | 11/2013 | Lin et al. | 257/774 |
| 8,604,602 B2 * | 12/2013 | Chow et al. | 257/692 |
| 2008/0006942 A1 * | 1/2008 | Park et al. | 257/738 |

(Continued)

*Primary Examiner* — Alexander Oscar Williams
(74) *Attorney, Agent, or Firm* — Ishimaru & Associates LLP (57) ABSTRACT

An integrated circuit packaging system and method of manufacture thereof includes: a substrate having a top insulation layer and a top conductive layer; an inter-react layer on the substrate; an integrated circuit die on the substrate; a package body on the inter-react layer and the integrated circuit die; and a top solder bump on the top conductive layer, the top solder bump in a 3D via formed through the package body, the inter-react layer, and the top insulation layer for exposing the top conductive layer in the 3D via.

20 Claims, 4 Drawing Sheets

(56) References Cited

U.S. PATENT DOCUMENTS

| | | | |
|---|---|---|---|
| 2009/0246909 A1* | 10/2009 | Takeuchi et al. | 438/106 |
| 2010/0171207 A1* | 7/2010 | Shen et al. | 257/686 |
| 2011/0024899 A1* | 2/2011 | Masumoto et al. | 257/737 |
| 2011/0233751 A1 | 9/2011 | Bae et al. | |
| 2012/0061825 A1* | 3/2012 | Chang et al. | 257/737 |
| 2013/0200528 A1* | 8/2013 | Lin et al. | 257/774 |
| 2013/0249106 A1* | 9/2013 | Lin et al. | 257/774 |
| 2014/0048906 A1* | 2/2014 | Shim et al. | 257/531 |
| 2014/0183731 A1* | 7/2014 | Lin et al. | 257/738 |
| 2014/0210101 A1* | 7/2014 | Lin et al. | 257/774 |

* cited by examiner

INTEGRATED CIRCUIT PACKAGING SYSTEM WITH SUBSTRATE AND METHOD OF MANUFACTURE THEREOF

CROSS-REFERENCE TO RELATED APPLICATION(S)

This application claims the benefit of U.S. Provisional Patent Application Ser. No. 61/655,431 filed Jun. 4, 2012, and the subject matter thereof is incorporated herein by reference thereto.

TECHNICAL FIELD

The present invention relates generally to an integrated circuit packaging system, and more particularly to a system for an integrated circuit packaging system with a substrate.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit die; encapsulating in a package body the integrated circuit die; applying an inter-react layer on the package body; forming a substrate on the inter-react layer, the substrate having a top insulation layer and a top conductive layer; forming a 3D via through the package body, the inter-react layer, and the top insulation layer for exposing the top conductive layer in the 3D via; and depositing a top solder bump in the 3D via on the top conductive layer.

The present invention provides an integrated circuit packaging system, including: a substrate having a top insulation layer and a top conductive layer; an inter-react layer on the substrate; an integrated circuit die on the substrate; a package body on the inter-react layer and the integrated circuit die; and a top solder bump on the top conductive layer, the top solder bump in a 3D via formed through the package body, the inter-react layer, and the top insulation layer for exposing the top conductive layer in the 3D via.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The same features are described using the same reference numbers.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct physical contact between one element and another element without an intervening element.

The term "processing" as used herein includes deposition of material or photoresist, patterning, exposure, development, etching, cleaning, and/or removal of the material or photoresist as required in forming a described structure.

Figure 1:
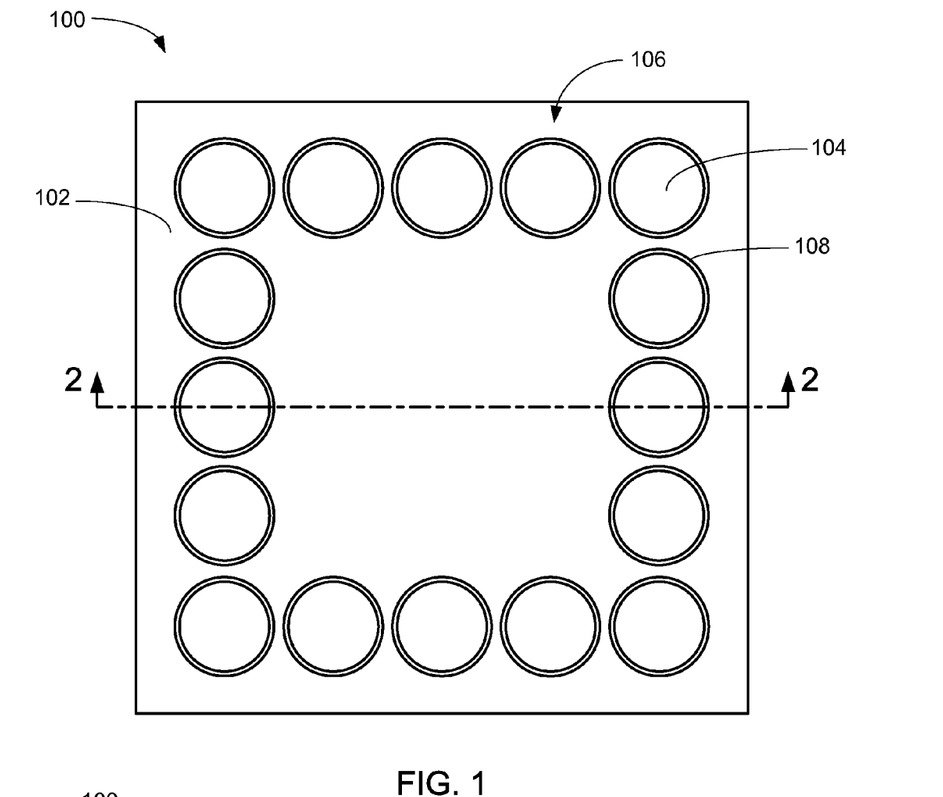
FIG. 1 is a top view of an integrated circuit packaging system in an embodiment of the present invention.

Referring now to FIG. 1, therein is shown a top view of an integrated circuit packaging system 100 in an embodiment of the present invention. The top view shows a warpage balance layer 102, a top solder bump 104 in a 3D (three-dimensional) via 106, and a portion of a package body 108. The warpage balance layer 102 can function as a stiffener to prevent warpage of an integrated circuit package by providing resistance to mechanical warpage. The warpage balance layer 102 can provide structural integrity for ultra-thin integrated circuit packages by mechanically preventing warping.

The warpage balance layer 102 can include a warp resistant material having a coefficient of thermal expansion (CTE) selected to balance warping forces exerted on the IC package during assembly, testing, or operation of the integrated circuit packaging system due to thermal stresses. For example, the warpage balance layer 102 can include a warp balance material including invar, alloy 42, a metallic material, and a metal alloy. The warpage balance layer 102 is an optional component of the integrated circuit packaging system 100.

The 3D via 106 goes through at least the warpage balance layer 102 and the package body 108. The top solder bump 104 can be seen in the 3D via 106 and is a conductive structure such as a solder ball. The 3D via 106 can also expose a portion of the package body 108 around the top solder bump 104. The package body 108, such as an encapsulation, can protect components from the outside environment.

For illustrative purposes, the top view shows a single row of the top solder bump 104 in the 3D via 106 around a central area of the integrated circuit packaging system 100, but it is understood that there can be different configurations of the top solder bump 104 and the 3D via 106. For example, there can be two, three, or more rows lined up in a grid, or the rows can be staggered.

It has been discovered that the warpage balance layer 102 provides improved reliability to the integrated circuit packaging system 100 because the warpage balance layer 102 eliminates warpage of the integrated circuit packaging system 100 due to differential thermal expansion forces and moments between the various material layers.

Figure 2:
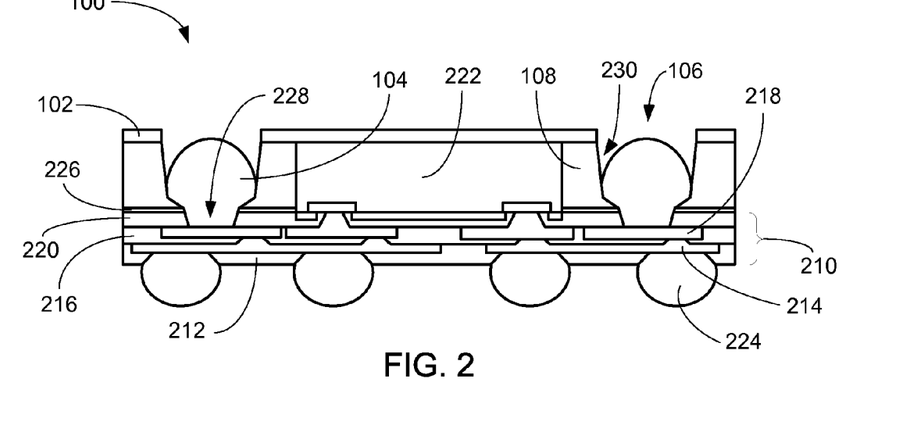
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having the top solder bump 104 in the 3D via 106, a substrate 210, an integrated circuit die 222, bottom connectors 224, the package body 108, an inter-react layer 226, and the warpage balance layer 102.

The substrate 210 can act as a redistribution layer (RDL), and can have, from the bottom to the top, a bottom insulation layer 212, a bottom conductive layer 214, a middle insulation layer 216, a top conductive layer 218, and a top insulation layer 220. The bottom conductive layer 214 and the top conductive layer 218 are embedded in the surrounding insulation layers, and exposed at various points from the top and bottom of the substrate 210. The bottom conductive layer 214 and the top conductive layer 218 can be made from a conductive metal such as copper, titanium, tungsten, or a combination thereof. The bottom insulation layer 212, the middle insulation layer 216, and the top insulation layer 220 can be made from an electrically insulative material such as a dielectric.

The substrate 210 is shown having five layers but it is understood that this is only an example and that the substrate 210 can have a different number of layers. For example, the substrate 210 could have 6, 7, 8, or more layers, alternating dielectric layers and conductive layers.

The integrated circuit die 222 is connected to the top conductive layer 218 and can be on the top insulation layer 220. For example, the active side of the integrated circuit die 222 can be on the bottom and connected to the top conductive layer 218. The integrated circuit die 222 can be attached to the top insulation layer 220 with a die-attach adhesive, for example. The inter-react layer 226 is shown directly on the top surface of the top insulation layer 220 laterally around the integrated circuit die 222. The inter-react layer 226 can be a thin, transparent layer, and can have a thickness of approximately 0.1-10 micrometers.

The inter-react layer 226 can function as barrier to selectively block to certain types of energy applied upon the inter-react layer. For example, the inter-react layer 226 can be sensitive to a specific wavelength or energy magnitude. The inter-react layer 226 can attenuate radiated energy directed towards the surface of the inter-react layer 226. The inter-react layer 226 can react or break down at a certain frequency range of electromagnetic radiation. For example, the inter-react layer 226 can also be referred to as an inter-action layer.

The package body 108 is directly on the inter-react layer 226. The package body 108 encapsulates the integrated circuit die 222. The package body 108, the warpage balance layer 102, the inter-react layer 226, and the top insulation layer 220 have the 3D via 106 going through them to expose a contact pad 228 of the top conductive layer 218 from the top insulation layer 220. The contact pad 228 can be made from materials such as titanium, tungsten, copper, or a combination thereof.

The 3D via 106 is defined as a hole in multiple layers of an integrated circuit package where the 3D via 106 has a sidewall 230 with at least two differently sloped sections due to a multi-step process used to form the 3D via 106. In this example, a hole bounded by the sidewall 230 with a steep slope goes through the warpage balance layer 102 and most of the way through the package body 108. The slope can change through the last portion of the package body 108 and change again through the inter-react layer 226 and the top insulation layer 220. The sidewall 230 can have a stepped multi-slope shape as a result of the changes in slope of the different sections of the sidewall 230 of the 3D via 106.

The 3D via 106 is shown as having various slopes at specific points, but it is understood that this is only an example and that the sides of the 3D via 106 can change in slope at different points. For example, the slope can change closer to the inter-react layer 226 than shown in this example.

The top solder bump 104 is in the 3D via 106 in direct contact with the contact pad 228 of the top conductive layer 218 and with a portion of the sidewall 230 of the 3D via 106. The top solder bump 104 conforms to the stepped multi-slope shape of the bottom of the 3D via 106, and therefore the top solder bump 104 also has a stepped multi-slope shape on the bottom portion of the top solder bump 104. The top of the top solder bump 104 can be below the top surface of the warpage balance layer 102.

The bottom connectors 224 can be connected to the bottom conductive layer 214 through the bottom insulation layer 212. The bottom connectors 224 are conductive structures such as solder balls, conductive columns, bumps, or posts.

Figure 3:
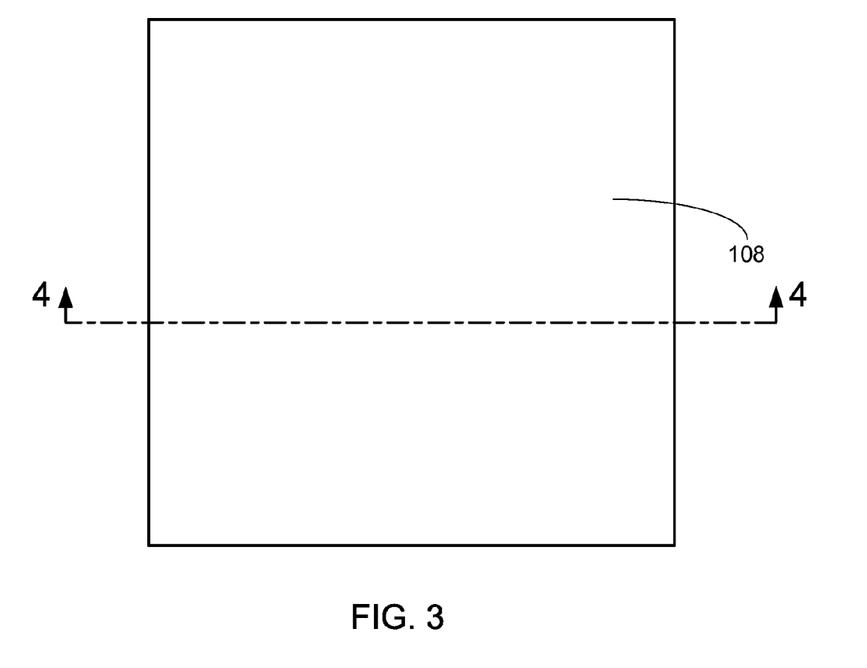
FIG. 3 is a top view of the package body in an encapsulation phase of manufacture.

Referring now to FIG. 3, therein is shown a top view of the package body 108 in an encapsulation phase of manufacture. In this view can be seen the package body 108 in a square configuration, though it is understood that other shapes are possible. For example, the package body 108 can be a rectangle, a pentagon, or other shape.

Figure 4:
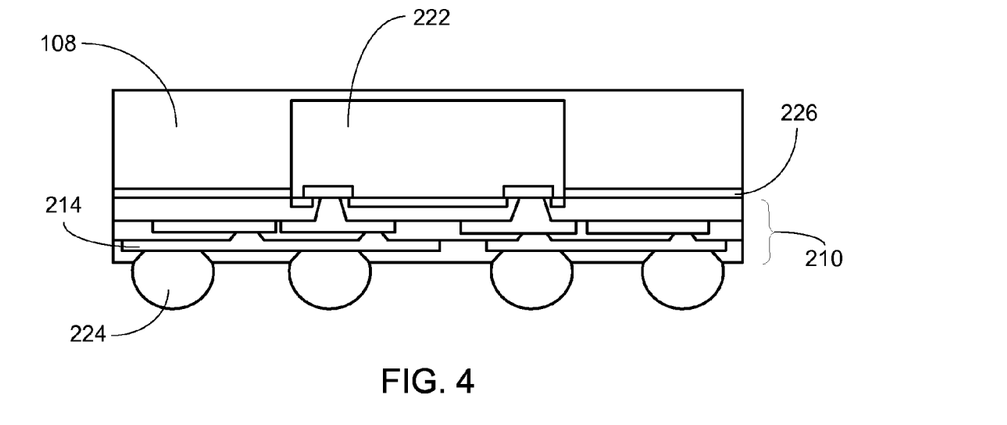
FIG. 4 is a cross-sectional view of the package body along the section line 4-4 of FIG. 3.

Referring now to FIG. 4, therein is shown a cross-sectional view of the package body 108 along the section line 4-4 of FIG. 3. The integrated circuit die 222 can be seen on the substrate 210 and embedded in the package body 108, with the bottom connectors 224 attached to the bottom of the substrate 210.

The substrate 210 and its various layers can be built up in order on the package body 108 with the integrated circuit die 222 already embedded. Alternatively, the substrate 210 can be formed first and the integrated circuit die 222 attached, followed by encapsulation with the package body 108. The inter-react layer 226 can be applied prior to the build-up of the layers of the substrate 210 or attachment of the integrated circuit die 222.

After connecting the substrate 210 to the integrated circuit die 222, the bottom connectors can be formed or deposited on the bottom conductive layer 214 through openings in the bottom insulation layer 212.

Figure 5:
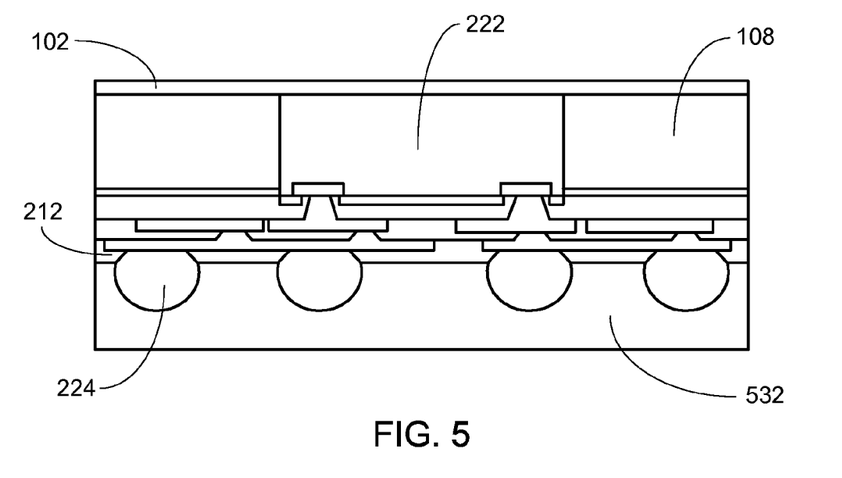
FIG. 5 is the structure of FIG. 4 in a warpage control phase of manufacture.

Referring now to FIG. 5, therein is shown the structure of FIG. 4 in a warpage control phase of manufacture. In this view, the warpage balance layer 102 can be seen applied directly to the top surface of the integrated circuit die 222.

After the formation or deposition of the bottom connectors 224, a back grinding tape 532 can optionally be applied to the bottom connectors 224 and the bottom insulation layer 212 to help hold the components in place. This is followed by a back grinding step performed by wet etching, chemical mechanical polishing/planarization (CMP), or dry etching to thin the package to a desired thickness and planarize the package body 108 and the integrated circuit die 222.

After the planarization, the warpage balance layer 102 can be applied to the top surface of the integrated circuit die 222 and the package body 108. The warpage balance layer 102 can be laminated, deposited, or otherwise formed on the integrated circuit die 222 and the package body 108. The back grinding tape 532, if present, can then be removed.

Figure 6:
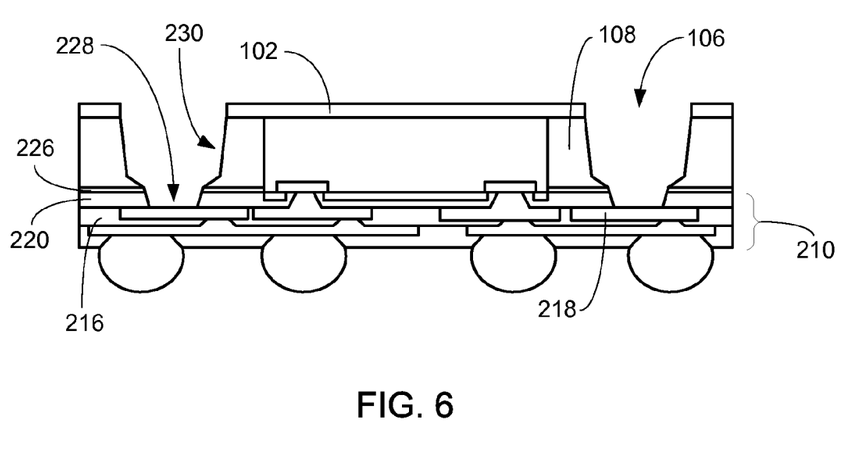
FIG. 6 is the structure of FIG. 5 in a via forming phase of manufacture.

Referring now to FIG. 6, therein is shown the structure of FIG. 5 in a via forming phase of manufacture. Portions of the warpage balance layer 102, the package body 108, the inter-react layer 226, and the top insulation layer 220 have been removed to form the 3D via 106.

The 3D via 106 can be formed in a few different ways. Multiple types of lasers can be used in a particular order to ablate or laser drill the 3D via 106. For example, a UV (ultraviolet) laser and an IR (infrared) laser can be used in combination to form the 3D via 106.

As a more specific example, first the IR laser can be used to remove or ablate the warpage balance layer 102 and a majority of a vertical portion of the package body 108, forming a recess in the package body 108. For example, the majority can be >=99% of the vertical height of the package body 108. This is followed by the UV laser being used to form a hole to complete the 3D via 106 by removing or ablating the remaining materials, including what is left of the package body 108, the inter-react layer 226, and the top insulation layer 220, to expose the contact pad 228.

As an alternate example, the UV laser can be used to ablate a hole in the warpage balance layer 102 before the IR laser is used to ablate most of a vertical portion of the package body 108. The rest of the process would remain the same. Because IR lasers are not very effective at removing transparent or semi-transparent materials, if the warpage balance layer 102 is transparent, the UV laser can be more efficient at full removal of the warpage balance layer 102 than the IR laser, which may leave behind too much residue.

Due to the ablation speed difference of IR and UV laser, the slope of the sidewall 230 of the 3D via 106 will change depending on which type of laser is applied. Higher speed laser ablation typically provides a steeper slope to the sidewall 230, and lower speed ablation typically provides a shallower slope of the sidewall 230. Rates of ablation through different materials can also affect the slope of the sidewall 230. For example, the change in slope of the sidewall 230 near the bottom of the package body 108 can mark the point at which the laser being used was switched from the IR laser to the UV laser, and the second change in slope can mark the point at which the package body 108 ends and the other layers begin. The differences in ablation speed of the IR and UV lasers can lead to the stepped multi-slope shape of the sidewall 230 of the 3D via 106.

There are many different types of lasers aside from IR and UV, and any laser with appropriate ablation characteristics through the package body 108 and the top insulation layer 220 can be used. For example, the type of laser used can include IR, UV, Green, or more specifically, yttrium aluminum garnet (YAG), neodymium-doped YAG (Nd-YAG), or carbon dioxide ($CO_2$).

The laser ablation mechanism can be configured with at least one UV laser head and at least 1 IR laser head to maximize manufacturing throughput and control good finishing quality on the substrate 210, which can also be referred to as the RDL stack. For example, one UV laser and 2 or more IR lasers can be integrated into the same mechanism.

Portions of the warpage balance layer 102, the package body 108, the inter-react layer 226, and the top insulation layer 220 which form the sidewall 230 of the 3D via 106 can have an uneven surface characteristic of laser ablation. For example, the uneven surface can include a shallow cavity, a micro recess, burn marks, or other removal marks.

After laser drilling or ablation, a cleaning process can be applied to the surfaces in the 3D via 106, such as a wet clean with solvent/deionized (DI) water with surfactant, plasma cleaning, or an etching step for the contact pad 228. To finish manufacturing the integrated circuit packaging system 100 of FIG. 1 requires that the top solder bump 104 of FIG. 1 be formed on the contact pad 228 in the 3D via 106 through a process such as solder paste printing or ball drop.

It has been discovered that the sidewall 230 of the 3D via 106 having multiple sloped surfaces at different angles due to a combination of different laser sources provides improved reliability because the multiple sloped surfaces of the sidewall 230 provide additional surface area for the top solder bump 104 to be attached. The additional surface area provides improved structural integrity of the top solder bump 104 for stacking another package or component over the integrated circuit packaging system 100.

It has been discovered that the uneven surface of the warpage balance layer 102, the package body 108, the inter-react layer 226, and the top insulation layer 220 which form the sidewall 230 of the 3D via 106 provides improved reliability. For example, the uneven surface of the sidewall 230 provides increased surface area for the top solder bump 104 to bond to resulting in improved structural rigidity.

It has been discovered that a combination of multiple lasers, including IR lasers and UV lasers, for forming the 3D via 106 in the substrate 210 provides improved reliability as well as increased throughput. The combination of the multiple lasers does this by addressing a number of challenges. An IR laser, especially at low power, is inefficient at ablating a hole or via on transparent and semi-transparent materials including transparent dielectric film, some kinds of the warpage balance layer 102, backside protection tape, or the inter-react layer 226. Thus, use of a low power IR laser can result in un-removed bits of the inter-react layer 226 or the top insulation layer 220 due to inefficient removal of transparent or semi-transparent materials. Using a high power IR laser to expose the contact pad 228 through the package body 108 will avoid the problem of un-removed material but can cause the separate problem of delamination between the contact pad 228 and the middle insulation layer 216. The UV laser is much slower than the IR laser at ablating both transparent and non-transparent material and leads to some difficulty to achieve high throughput, but does not cause delamination problems. Thus, the use of a high power IR laser to quickly create a hole in the package body 108 followed by the use of a UV laser to ablate the remaining layers, including the inter-react layer 226, which is transparent, will lead to high throughput without delamination problems.

It has been discovered that the inter-react layer 226 provides improved reliability because the inter-react layer 226 functions as a barrier to selectively block particular forms of energy applied on a surface of the inter-react layer 226. For example, the inter-react layer 226, being transparent, can provide a way to ensure an IR laser can be changed before reaching any insulation layers to a different laser source to reliably form the 3D via 106 through the top insulation layer 220 without delamination between the contact pad 228 and the middle insulation layer 216.

It has been discovered that a combination of multiple lasers, including the IR laser and the UV laser, for forming the 3D via 106 provides improved ablation accuracy because the laser source with a narrower beam width is used to partially remove the inter-react layer 226 and the top insulation layer 220. The laser source with the narrower beam width than a laser source with a wider beam width allows the ablation to be performed with precision directly over a predetermined location of the top conductive layer 218 thereby providing improved ablation quality.

Figure 7:
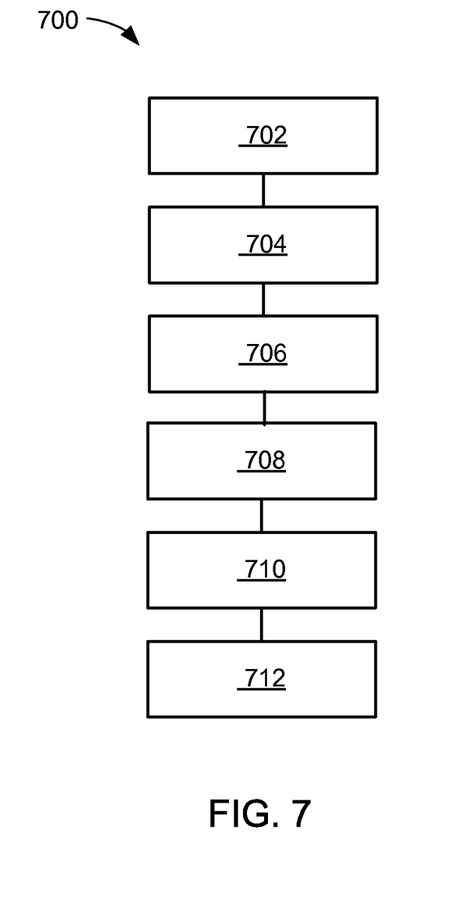
FIG. 7 is a flow chart of a method of manufacture of the integrated circuit packaging system in a further embodiment of the present invention.

Referring now to FIG. 7, therein is shown a flow chart of a method 700 of manufacture of the integrated circuit packaging system in a further embodiment of the present invention. The method 700 includes: providing an integrated circuit die in a block 702; encapsulating in a package body the integrated circuit die in a block 704; applying an inter-react layer on the package body in a block 706; forming a substrate on the inter-react layer, the substrate having a top insulation layer and a top conductive layer in a block 708; forming a 3D via through the package body, the inter-react layer, and the top insulation layer for exposing the top conductive layer in the 3D via in a block 710; and depositing a top solder bump in the 3D via on the top conductive layer in a block 712.

Thus, it has been discovered that the integrated circuit packaging system 100 of the present invention furnishes important and heretofore unknown and unavailable solutions, capabilities, and functional aspects for an integrated circuit packaging system with substrate. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing an integrated circuit die;
    encapsulating in a package body the integrated circuit die;
    applying an inter-react layer on the package body;
    forming a substrate on the inter-react layer, the substrate having a top insulation layer and a top conductive layer;
    forming a 3D via through the package body, the inter-react layer, and the top insulation layer for exposing the top conductive layer in the 3D via; and
    depositing a top solder bump in the 3D via on the top conductive layer.

2. The method as claimed in claim 1 further comprising applying a warpage balance layer on a top surface of the package body and the integrated circuit die.

3. The method as claimed in claim 1 wherein forming the 3D via through the package body, the inter-react layer, and the top insulation layer for exposing the top conductive layer in the 3D via includes:
    forming a recess in the package body with an IR laser; and
    forming a hole through a remaining portion of the package body, the inter-react layer, and the top insulation layer with a UV laser for exposing the top conductive layer.

4. The method as claimed in claim 1 further comprising attaching bottom connectors to the substrate.

5. The method as claimed in claim 1 wherein forming the 3D via includes forming the 3D via with a sidewall having a stepped multi-slope shape.

6. A method of manufacture of an integrated circuit packaging system comprising:
    providing an integrated circuit die;
    encapsulating in a package body the integrated circuit die;
    applying an inter-react layer on the package body;
    forming a substrate on the inter-react layer, the substrate having a top insulation layer and a top conductive layer;

applying a warpage balance layer on a top surface of the package body and the integrated circuit die;
forming a 3D via through the warpage balance layer, the package body, the inter-react layer, and the top insulation layer for exposing the top conductive layer in the 3D via; and
depositing a top solder bump in the 3D via on the top conductive layer.

7. The method as claimed in claim 6 wherein depositing the top solder bump on the top conductive layer includes depositing the top solder bump on a contact pad of the top conductive layer.

8. The method as claimed in claim 6 wherein forming a 3D via through the warpage balance layer, the package body, the inter-react layer, and the top insulation layer for exposing the top conductive layer in the 3D via includes:
forming a recess through the warpage balance layer and in the package body with an IR laser; and
forming a hole through a remaining portion of the package body, the inter-react layer, and the top insulation layer with a UV laser for exposing the top conductive layer.

9. The method as claimed in claim 6 forming a 3D via through the warpage balance layer, the package body, the inter-react layer, and the top insulation layer for exposing the top conductive layer in the 3D via includes:
forming a hole in the warpage balance layer with a UV laser;
forming a recess in the package body with an IR laser; and
forming a hole through a remaining portion of the package body, the inter-react layer, and the top insulation layer with the UV laser for exposing the top conductive layer.

10. The method as claimed in claim 6 further comprising connecting the integrated circuit die to the top conductive layer.

11. An integrated circuit packaging system comprising:
a substrate having a top insulation layer and a top conductive layer;
an inter-react layer on the substrate;
an integrated circuit die on the substrate;
a package body on the inter-react layer and the integrated circuit die; and
a top solder bump on the top conductive layer, the top solder bump in a 3D via formed through the package body, the inter-react layer, and the top insulation layer for exposing the top conductive layer in the 3D via.

12. The system as claimed in claim 11 further comprising a warpage balance layer on a top surface of the package body and the integrated circuit die.

13. The system as claimed in claim 11 wherein the 3D via has a sidewall having an uneven surface.

14. The system as claimed in claim 11 further comprising bottom connectors on the substrate.

15. The system as claimed in claim 11 wherein the 3D via has a sidewall having a stepped multi-slope shape.

16. The system as claimed in claim 11 further comprising:
a warpage balance layer on a top surface of the package body and the integrated circuit die; and
wherein:
the 3D via is formed through the warpage balance layer, the package body, the inter-react layer, and the top insulation layer for exposing the top conductive layer in the 3D via.

17. The system as claimed in claim 16 wherein the top conductive layer includes a contact pad in direct contact with the top solder bump.

18. The system as claimed in claim 16 wherein the 3D via has a sidewall having a steeper slope of an upper section than a slope of a lower section.

19. The system as claimed in claim 16 wherein the inter-react layer is transparent or semi-transparent.

20. The system as claimed in claim 16 wherein the integrated circuit die is connected to the top conductive layer.

* * * * *